(12) United States Patent
Choo et al.

(10) Patent No.: US 11,736,112 B2
(45) Date of Patent: Aug. 22, 2023

(54) DIGITALLY CONTROLLED OSCILLATOR INSENSITIVE TO CHANGES IN PROCESS, VOLTAGE, TEMPERATURE AND DIGITAL PHASE LOCKED LOOP INCLUDING SAME

(71) Applicant: SAMSUNG ELECTRONICS CO., LTD., Suwon-si (KR)

(72) Inventors: Kangyeop Choo, Hwaseong-si (KR); Wooseok Kim, Suwon-si (KR); Wonsik Yu, Anyang-si (KR); Chanyoung Jeong, Hwaseong-si (KR)

(73) Assignee: SAMSUNG ELECTRONICS CO., LTD.

( * ) Notice: Subject to any disclaimer, the term of this patent is extended or adjusted under 35 U.S.C. 154(b) by 0 days.

(21) Appl. No.: 17/675,351

(22) Filed: Feb. 18, 2022

(65) Prior Publication Data

US 2022/0385294 A1 Dec. 1, 2022

(30) Foreign Application Priority Data

May 28, 2021 (KR) .......... 10-2021-0069533

(51) Int. Cl.
*H03L 7/099* (2006.01)
*H03B 5/04* (2006.01)
*H03L 7/093* (2006.01)

(52) U.S. Cl.
CPC ............ *H03L 7/0992* (2013.01); *H03B 5/04* (2013.01); *H03L 7/093* (2013.01)

(58) Field of Classification Search
CPC ... H03B 5/02; H03B 5/04; H03B 5/06; H03B 5/00

See application file for complete search history.

(56) References Cited

U.S. PATENT DOCUMENTS

| 6,753,738 | B1 | 6/2004 | Baird | |
|---|---|---|---|---|
| 7,259,543 | B2 * | 8/2007 | Chih | G05F 3/30 323/314 |
| 7,432,771 | B2 * | 10/2008 | Chui | H03K 4/502 331/113 R |
| 8,531,243 | B2 | 9/2013 | Yoo et al. | |
| 9,712,111 | B2 | 7/2017 | Fukuzawa | |
| 10,103,740 | B2 * | 10/2018 | Pavao Moreira | H03B 5/04 |
| 10,359,793 | B2 | 7/2019 | Kim et al. | |
| 10,747,250 | B2 | 8/2020 | Lee et al. | |
| 10,812,054 | B2 | 10/2020 | Choo et al. | |
| 2015/0109060 | A1 | 4/2015 | Huang et al. | |
| 2021/0011506 | A1 | 1/2021 | Lee et al. | |

FOREIGN PATENT DOCUMENTS

| KR | 101183738 | 9/2012 |
|---|---|---|
| KR | 1020170002092 | 1/2017 |

* cited by examiner

*Primary Examiner* — Diana J. Cheng
(74) *Attorney, Agent, or Firm* — Fish & Richardson P.C.

(57) ABSTRACT

A digitally controlled oscillator (DCO) includes; a current mirror configured to generate a supply current in response to a bias voltage matching a reference current, a variable resistor connected to the current mirror through a first node outputting the reference current and configured to provide a variable resistance in response to a first control signal, an oscillation circuit connected to the current mirror through a second node outputting the supply current and configured to generate an oscillation signal in response to the supply current, and a feedback circuit configured to control the bias voltage in relation to at least one of a voltage at the first node and a voltage at the second node.

16 Claims, 16 Drawing Sheets

DIGITALLY CONTROLLED OSCILLATOR INSENSITIVE TO CHANGES IN PROCESS, VOLTAGE, TEMPERATURE AND DIGITAL PHASE LOCKED LOOP INCLUDING SAME

CROSS-REFERENCE TO RELATED APPLICATION

This application claims priority under 35 U.S.C. § 119 to Korean Patent Application No. 10-2021-0069533 filed on May 28, 2021 in the Korean Intellectual Property Office, the subject matter of which is hereby incorporated by reference in its entirety.

BACKGROUND

The inventive concept relates to a digitally controlled oscillator (DCO), and more particularly, to a DCO including a current mirror.

In integrated circuits, various oscillation signals (e.g., clock signals) may be used in variety of ways. For example, operations of an integrated circuit related to digital signal(s) may be synchronized with one or more oscillation signal(s). Oscillating signal(s) may also be variously used to process analog signals, such as radio frequency (RF) signals. In order to generate an oscillation signal, various digital circuits such as a digital phase locked loop (PLL) may be used. Some of these digital circuits use a DCO to ensure proper performance characteristics.

However, the DCO is not without its own problems. For example, due to certain structural aspects, the DCO may exhibit variable performance in response to changes in process, voltage and/or temperature (hereafter singularly or collectively, PVT). And such variability causes problems such as fluctuating frequency of an oscillation signal.

SUMMARY

The inventive concept provides a DCO capable of stably providing an oscillation signal having a desired frequency that is relatively insensitive to changes in PVT.

According to an aspect of the inventive concept, there is provided a digitally controlled oscillator (DCO) including; a current mirror configured to generate a supply current in response to a bias voltage matching a reference current, a variable resistor connected to the current mirror through a first node outputting the reference current and configured to provide a variable resistance in response to a first control signal, an oscillation circuit connected to the current mirror through a second node outputting the supply current and configured to generate an oscillation signal in response to the supply current, and a feedback circuit configured to control the bias voltage in relation to at least one of a voltage at the first node and a voltage at the second node.

According to an aspect of the inventive concept, there is provided a digitally controlled oscillator (DCO) including; a current mirror including a third node and configured to generate a supply current in response to a bias voltage matching a reference current, a variable resistor connected to the current mirror through a first node outputting the reference current and configured to provide a variable resistance, an oscillation circuit connected to the current mirror through a second node outputting the supply current and configured to receive the supply current, and an amplifier including, a first input connected to the first node to receive a voltage at the first node, a second input connected to the second node to receive a voltage at the second node, and an output connected to the third node, wherein the amplifier is configured to generate feedback in response to a difference between the voltage at the first node and the voltage of the second node, and provide the feedback to the third node.

According to an aspect of the inventive concept, there is provided a digital phase locked loop (PLL) including; a divider configured to divide a clock signal and output a divided signal, a time-to-digital converter configured to compare the divided signal with a reference signal and output a comparison signal, a digital loop filter configured to output a control signal in response to the comparison signal, and a digital control oscillator (DCO) configured to output a clock signal having a frequency adjusted in response to the control signal. The DCO includes; a current mirror including a third node and configured to generate a supply current in response to a bias voltage matching a reference current, a variable resistor connected to the current mirror through a first node outputting the reference current, an oscillation circuit connected to the current mirror through a second node outputting the supply current, and an amplifier including a first input terminal connected to the first node, a second input terminal connected to the second node, and an output terminal connected to the third node.

BRIEF DESCRIPTION OF THE DRAWINGS

Embodiments of the inventive concept may be more clearly understood upon consideration of the following detailed description taken in conjunction with the accompanying drawings in which.

DETAILED DESCRIPTION

Throughout the written description and drawings, like reference numbers and labels are used to denote like or similar elements, components and/or method steps.

Figure 1:
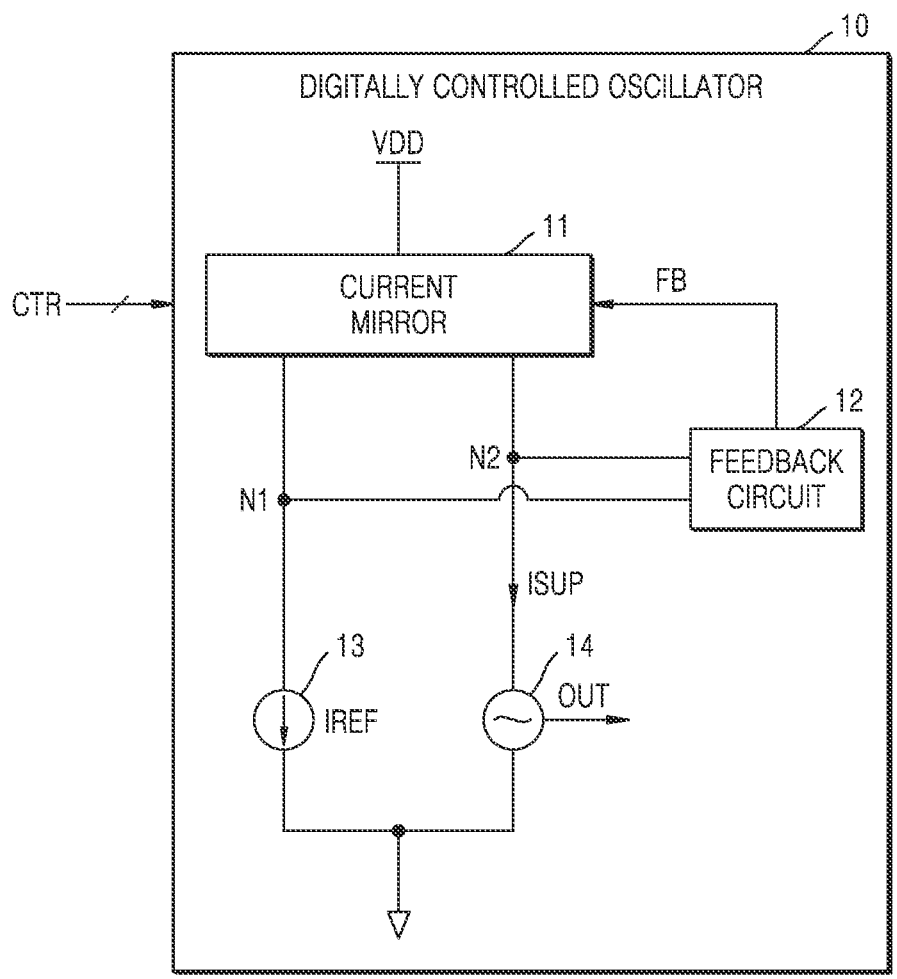
FIG. 1 is a block diagram illustrating a digitally controlled oscillator (DCO) according to an embodiment of the inventive concept.

FIG. 1 is a block diagram illustrating a digitally controlled oscillator (DCO) 10 according to an embodiment of the inventive concept. In some embodiments, the DCO 10 may be implemented as an integrated circuit (IC) manufactured according to semiconductor process, and may include at least one semiconductor package and a board (e.g., a printed circuit board or PCB) mounting the semiconductor package.

The DCO 10 may generate an output signal OUT that oscillates with a frequency adjusted (or defined) according to a digital control signal CTR including at least one bit. As shown in FIG. 1, the DCO 10 may include a current mirror 11, a feedback circuit 12, a reference current source 13, and an oscillation circuit 14. The current mirror 11 may be connected to the feedback circuit 12, the reference current source 13, and the oscillation circuit 14, and may generate a supply current ISUP in response to (on the basis of) a reference current IREF. The reference current source 13 may draw the reference current IREF from the current mirror 11, and the oscillation circuit 14 may generate the output signal OUT having a frequency that varies (or changes) according to the supply current ISUP. The level (or magnitude) of the reference current IREF and/or the supply current ISUP may be varied according to the control signal CTR. As a result, the frequency of the output signal OUT may be adjusted in relation to the control signal CTR. The term "output signal OUT" in this regard is used to generically denote an oscillation signal (e.g., a clock signal or similar), wherein the frequency of the output signal OUT may be referred to as an "output frequency."

Due to often minute imperfections or variations in the semiconductor process used to manufacture the IC, a decrease in supply voltage and/or an increase in leakage current may arise. Generally, it has been difficult to design analog circuits exhibiting acceptable performance in relation to the generation of an oscillation signal. Accordingly, digital circuits have largely replaced analog circuits in this capacity. Indeed, one or more digital circuit(s) generating corresponding oscillation signals having different purposes may be apparent in contemporary and emerging integrated circuits. For example, a digital phase locked loop (PLL) may be used to replace an analog charge pump PLL (CPPLL) circuit. However, the performance of the digital PLL may depend on the performance of an associated DCO.

Recognizing this fact and referring to FIG. 1, a bias voltage of the current mirror 11 may vary according to variations (or changes) in PVT, which may cause the reference current IREF and/or the supply current ISUP to vary, thereby affecting the stability of the output frequency of the output signal OUT. Such instability of the output frequency may negatively affect the performance of the DCO 10. Thus, the stability of the bias voltage of the current mirror 11 is one factor in the generation of the supply current ISUP. (See e.g., FIGS. 3A, 3B and 4).

In this regard, the feedback circuit 12 may be used to suppress variations in the bias voltage of the current mirror 11 caused by variations in PVT. In some embodiments, the feedback circuit 12 may be connected to the current mirror 11 through a first node N1 and a second node N2. The first node N1 may be a node to which the current mirror 11 and the reference current source 13 are connected, and the second node N2 may be a node to which the current mirror 11 and the oscillation circuit 14 are connected. The feedback circuit 12—receiving a first voltage apparent at the first node N1 and a second voltage apparent at the second node N2—may generate feedback FB based on the first voltage and the second voltage. The feedback FB may then be applied to the current mirror 11 to control the bias voltage of the current mirror 11. For example, the feedback FB may suppress variations in the bias voltage due to variation in PVT. That is, the feedback FB may serve as a negative feedback with respect to the bias voltage applied to the current mirror 11.

In relation to FIG. 1 an embodiment has been described in which the bias voltage of the current mirror 11 varies in relation to variations in PVT, however, the inventive concept is not limited thereto, and other embodiments of the inventive concept may be applied other parameters (e.g., power voltage VDD) that vary in accordance with variations in PVT.

Thus, the DCO 10 of FIG. 1, uses negative feedback provided by the feedback circuit 12 to compensate for variations in the bias voltage of the current mirror 11 resulting from variations in PVT, thereby generating the output signal OUT that is relatively insensitive to variations in PVT. Of further note, the DCO 10 does not require additional circuitry (consuming additional power) beyond the feedback circuit 12, thereby ensuring that the DCO 10 operates with relatively low power consumption.

Figure 2:
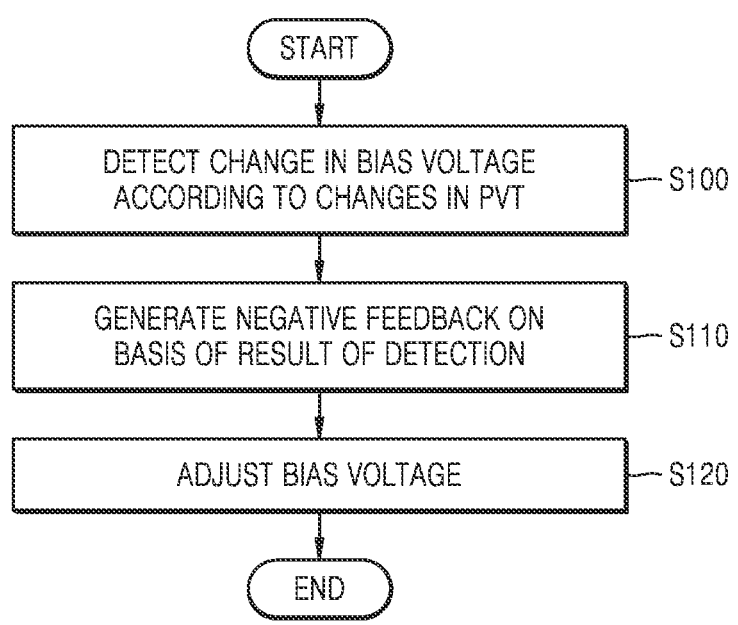
FIG. 2 is a flowchart illustrating an operating method for a DCO according to an embodiment of the inventive concept.

FIG. 2 is a flowchart illustrating an operating method for a DCO according to an embodiment of the inventive concept.

Referring to FIG. 2, the DCO may detect a change in a bias voltage of a current mirror according to changes in PVT (S100). In some embodiments, the DCO may detect the change in the bias voltage (e.g., a change detection) by monitoring a voltage of a node providing (or outputting) a reference current generated by the current mirror. The DCO may then generate negative feedback that suppresses (or compensates for) the change in the bias voltage based on the change detection (S110). The DCO may then adjust the bias voltage by applying the negative feedback to the current mirror.

Figure 3A:
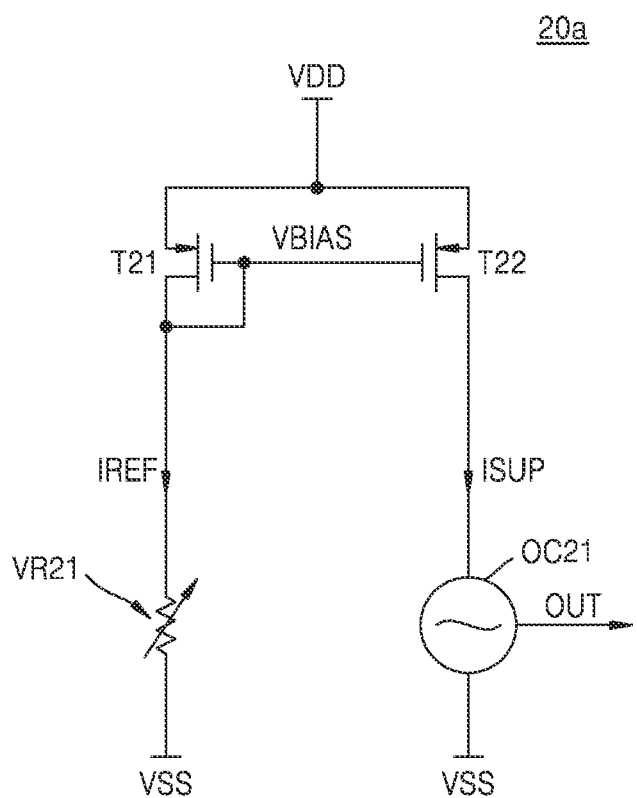
FIGS. 3A and 3B are respective circuit diagrams illustrating comparative examples of DCOs.
Figure 3B:
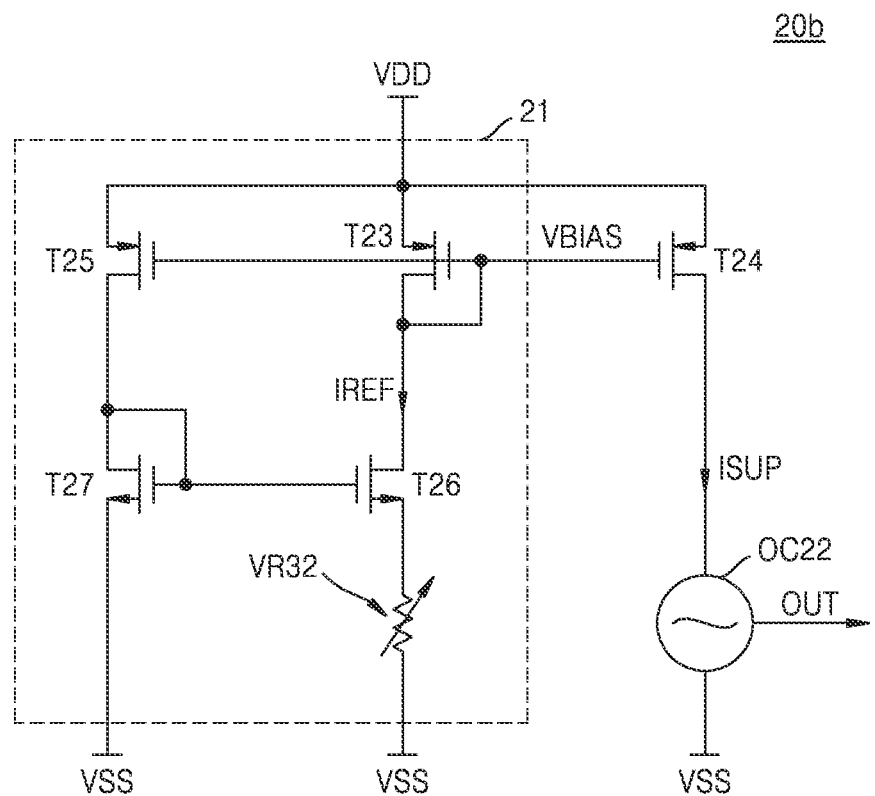

FIGS. 3A and 3B are respective circuit diagrams illustrating comparative example DCOs.

That is, FIG. 3A illustrates a DCO 20a in which a frequency of the output signal OUT is adjusted according to a resistance of a variable resistor VR21, and FIG. 3B illustrates a DCO 20b including a Beta multiplier reference circuit (BMR).

Referring to FIG. 3A, the DCO 20a includes transistors T21 and T22 forming a current mirror, wherein the variable resistor VR21 determines the magnitude of the reference current IREF, and an oscillation circuit OC21 generates the output signal OUT according to the supply current ISUP. The current mirror (i.e., transistors T21 and T22) may be P-channel field-effect transistors (FETs) and sharing a bias voltage VBIAS. In some embodiments, the FET may be a Metal-Oxide-Semiconductor FET (MOSFET). As the resistance of the variable resistor VR21 decreases, the reference current IREF increases—accordingly, the frequency of the output signal OUT increases as the supply current ISUP increases. And as the resistance value of the variable resistor VR21 increases, the reference current IREF decreases—accordingly, the frequency of the output signal OUT decreases as the supply current ISUP decreases.

The DCO 20a of FIG. 3A is sensitive to changes in the power voltage VDD or the bias voltage VBIAS. That is, the power voltage VDD or the bias voltage VBIAS may vary in accordance with changes in PVT, and the reference current IREF may vary in accordance with voltages variations at either end of the variable resistor VR21. As a result, the frequency of the output signal OUT will vary due to changes in the power voltage VDD.

Referring to FIG. 3B and in contrast to the embodiment of FIG. 3A, the DCO 20b may employ a BMR 21. Referring to FIG. 3B, the DCO 20b may include an oscillator circuit OC22 and a P-channel transistor T24 providing the supply current ISUP to the oscillator circuit OC22.

The BMR 21 may include two P-channel transistors T25 and T23, two N-channel transistors T27 and T26, and a variable resistor VR32. When the reference current IREF increases due to changes in PVT, the voltage of a source of the N-channel transistor T26 may increase by the variable resistor VR32. Accordingly, a gate-source voltage of the N-channel transistor T26 may decrease. The decreased gate-source voltage may reduce a drain current of the N-channel transistor T26, that is, the reference current IREF. Consequently, the BMR 21 may provide negative feedback.

The reference current IREF may be stably maintained by the BMR 21, but the BMR 21 may exhibit poor performance characteristics, such as high noise sensitivity and notable power consumption. For example, when the supply current ISUP is obtained by amplifying the relatively small reference current IREF according to a ratio of sizes of the two P-channel transistors T23 and T24 forming the current mirror, noise caused by the BMR 21 may also be amplified, and accordingly, the output signal OUT generated by the oscillation circuit OC22 may be unstable. Further, when a relatively large reference current IREF is employed, the DCO 20b may have relatively high power consumption due to the BMR 21.

When compared to the DCO 20a of FIG. 3A and the DCO 20b of FIG. 3B, DCOs according to embodiments of the inventive concept operate with relatively low power consumption and are yet able to generate an output signal that is remarkably insensitive to changes in PVT.

Figure 4:
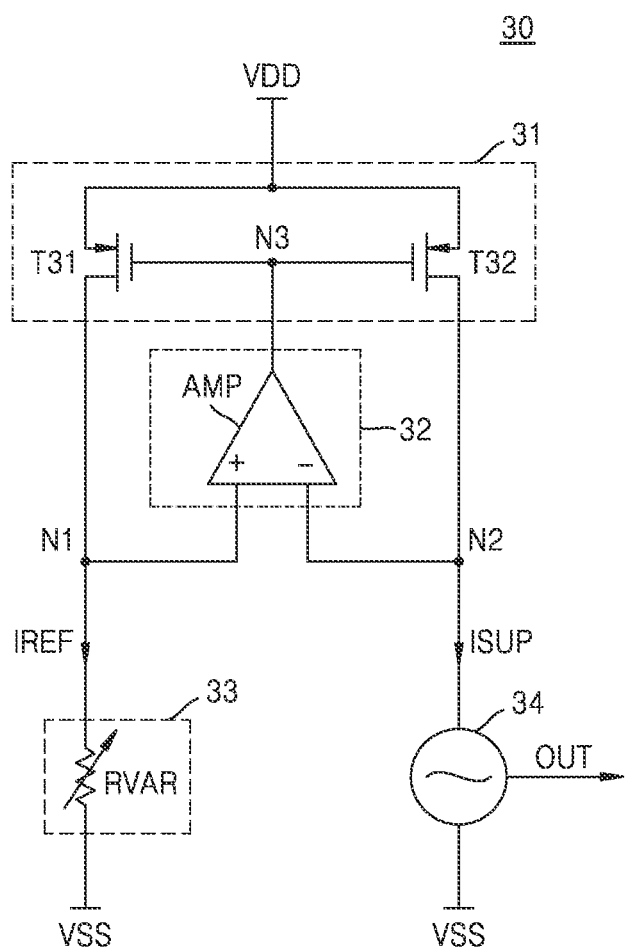
FIG. 4 is a circuit diagram illustrating a DCO according to an embodiment of the inventive concept.

FIG. 4 is a circuit diagram illustrating a DCO 30 according to an embodiment of the inventive concept. Referring to FIG. 4, the DCO 30 may include a current mirror 31, a feedback circuit 32, a variable resistor 33, and an oscillation circuit 34.

The current mirror 31 may be used to generate the supply current ISUP based on the bias voltage VBIAS matching the reference current IREF, and provide the supply current ISUP to the oscillation circuit 34. The current mirror 31 may include first and second transistors T31 and T32. The first transistor T31 may generate the bias voltage VBIAS based on the reference current IREF, and the second transistor T32 may generate the supply current ISUP based on the bias voltage VBIAS. A ratio of the supply current ISUP to the reference current IREF may be determined according to a ratio between a size (e.g., a channel width) of the second transistor T32 and a size of the first transistor T31.

One end of the variable resistor 33 may be connected to the current mirror 31 through a first node N1 and the other end of the variable resistor 33 may be connect to ground. Similar to the reference current source 13 of FIG. 1, the variable resistor 33 of FIG. 4 may provide a variable resistance (RVAR) to the DCO 30. In some embodiments, the variable resistor 33 may include a plurality of resistors and a plurality of switches, wherein each of the switches may be selectively turned ON/OFF in accordance with one or more bit(s) of a control signal in order to electrically connect/disconnect corresponding resistors in relation to the variable resistor 33. The reference current IREF may pass through the variable resistor 33, and a voltage apparent at the first node N1 is a reference voltage, the magnitude of which may be determined according to a magnitude of the reference current IREF and a resistance of the variable resistance RVAR provided by the variable resistor 33. One possible example of the variable resistor 33 will be described hereafter in some additional detail with reference to FIG. 11A.

The oscillation circuit 34 may receive the supply current ISUP through the second node N2 and generate the output signal OUT having an output frequency that varies in accordance with the supply current ISUP. That is, the oscillation circuit 34 may receive the supply current ISUP such that a variable voltage is apparent at the second node N2. Examples of possible oscillation circuit 33 will be described hereafter in some additional detail with reference to FIGS. 5A and 5B.

In some embodiments, the feedback circuit 32 may include an amplifier AMP. The amplifier AMP may include; a first input terminal connected to the first node N1 receiving the reference current IREF, a second input terminal connected to the second node N2 receiving the supply current ISUP, and an output terminal connected to a third node N3 (e.g., an internal node associated with the current mirror 31). The first node N1 may be connected to the variable resistor 33 so that the voltage apparent at the first node N1 may sensitively change in accordance with the magnitude of the reference current IREF. The second node N2 may be connected to the oscillation circuit 34 so that the voltage apparent at the second node N2 may change insensitively in accordance with the magnitude of the supply current ISUP. Accordingly, a change in a difference between the voltage at the first node N1 and a voltage at the second node N2 may indicate a change in the reference current IREF, and therefore, a change in the bias voltage VBIAS.

In some embodiments, the amplifier AMP may compare the voltage at the first node N1 with the voltage at the second node N2 in order to generate feedback based on the comparison result. That is, the amplifier AMP may amplify a difference between the voltage at the first node N1 and the voltage at the second node N2, and then output the amplified voltage as feedback. An amplification ratio for the amplifier AMP may be appropriately set in relation to the level of the bias voltage VBIAS. For example, a calibration operation associated with the DCO 30 may be used to set the amplification ratio of the amplifier AMP.

In some embodiments, the amplifier AMP may provide feedback to the third node N3 through the output terminal. The amplifier AMP may reduce change in the bias voltage VBIAS associated with change in PVT by providing the feedback to the current mirror 31. As a result, the current mirror 31 may generate a constant reference current IREF and/or supply current ISUP even despite the change in PVT.

For example, the amplifier AMP may generate feedback for increasing the bias voltage VBIAS in response to the voltage at the first node N1 that increases as the bias voltage VBIAS decreases due to change in PVT, and may generate feedback for reducing the bias voltage VBIAS in response to the voltage at the first node N1 that decreases as the bias voltage VBIAS increases due to change in PVT. As a result, the amplifier AMP may provide negative feedback to the bias voltage VBIAS through the third node N3 of the current mirror 31.

In this manner, for example, the DCO 30 may generate the output signal OUT insensitive to change in PVT, as compared with the DCO 20a of FIG. 2A and the DCO 20b of FIG. 2B. Further, the DCO 30 need include an additional path through which the reference current IREF flows, thereby reducing power consumption.

Figure 5A:
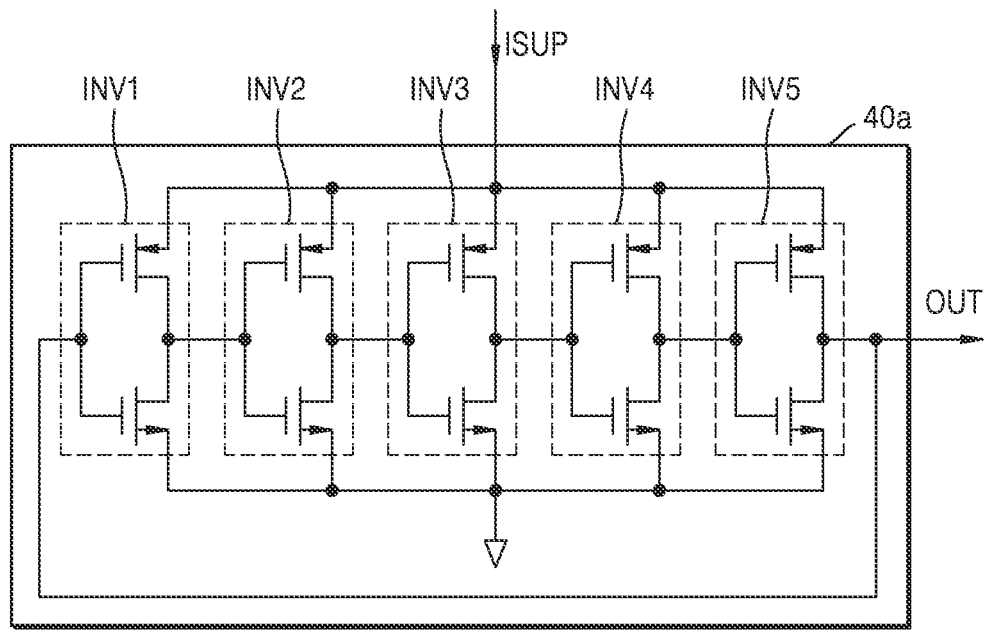
FIG. 5A is a circuit diagram and FIG. 5B is a block diagram illustrating oscillation circuits according to embodiments of the inventive concept.
Figure 5B:
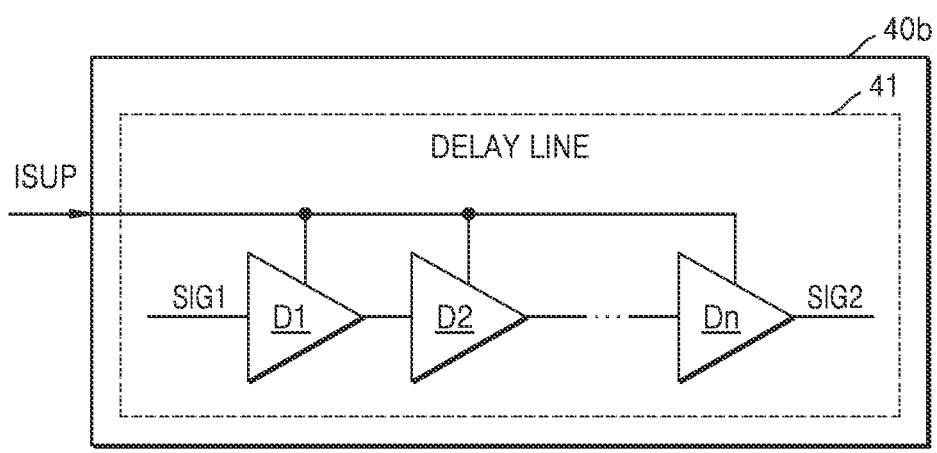

FIG. 5A is a circuit diagram and FIG. 5b is a block diagram illustrating examples of oscillation circuits 40a and 40b according to embodiments of the inventive concept. Here, each of the oscillation circuits 40a and 40b of FIGS. 5A and 5B may be used to generate the output signal OUT having an output frequency that varies in accordance with the supply current ISUP.

Referring to FIG. 5A, the oscillation circuit 40a may include a ring oscillator. As shown in FIG. 5A, the oscillation circuit 40a may include a chain of inverters including (e.g.,) INV1, INV2, INV3, INV4 and INV5 (hereafter collectively, "INV1 to INV5"), wherein each of the inverters INV1 to INV5 receives the supply current ISUP. Each of the inverters INV1 to INV5 may provide a delay that varies in accordance with the supply current ISUP. Hence, the output frequency of the output signal OUT may vary in accordance with the supply current ISUP.

Referring to FIG. 5B, the oscillation circuit 40b may include a delay line 41 (e.g., a delay line of a delay locked loop (DLL)). As shown in FIG. 5B, the delay line 41 may include a series of delay cells (e.g., D1, D2, . . . , Dn, wherein 'n' is an integer greater than 2). Each of the delay cells D1, D2, . . . , Dn may receive the supply current ISUP, such that each of the delay cells D1, D2, . . . , Dn may provide a delay that varies in accordance with the supply current ISUP, That is a second (or output) signal SIG 2 may be variably delayed in relation to a first (or input) signal SIG1.

Figure 6:
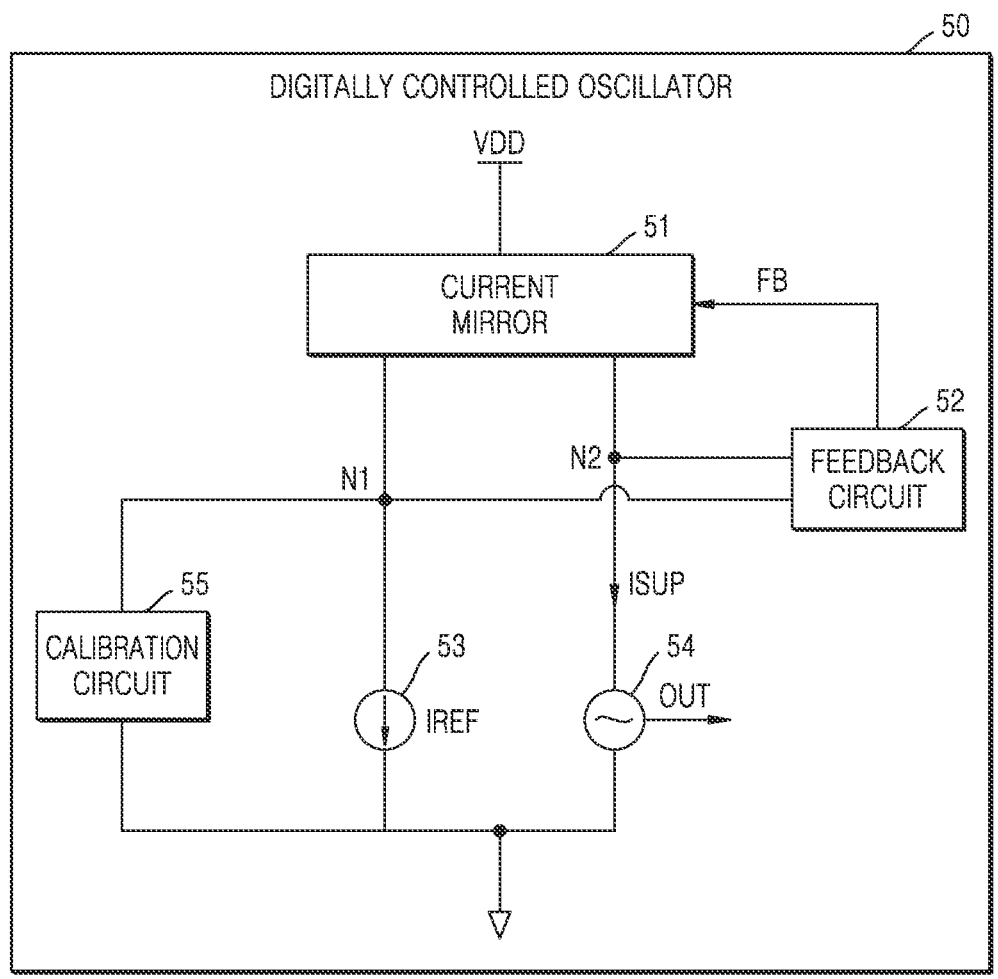
FIG. 6 is a block diagram illustrating a DCO according to an embodiment of the inventive concept.

FIG. 6 is a block diagram illustrating a DCO 50 according to an embodiment of the inventive concept. As shown in FIG. 6, the DCO 50 may include a current mirror 51, a feedback circuit 52, a reference current source 53, an oscillation circuit 54, and a calibration circuit 55. Only material difference(s) between the embodiment of FIG. 6 and the previous description provided in relation to FIG. 1 will be highlighted.

Here, a voltage at the first node N1 may change in accordance with a change in temperature, which may in some embodiments be due to the fact that the reference current source 53 is implemented like the variable resistor 33 of FIG. 4, wherein the resistance RVAR of the variable resistor 33 may be influenced by temperature. Accordingly, a change in the voltage at the first node N1 due to variation in temperature may destabilize the output frequency of the output signal OUT.

Referring to FIG. 6, the calibration circuit 55 may be connected in parallel with the reference current source 53 between the first node N1 and ground. In some embodiments, the calibration circuit 55 may generate a calibration current essentially removing (or compensating for) a change in the voltage at first node N1 due to variation in temperature. That is, the calibration circuit 55 may adjust the magnitude of the calibration current drawn from the first node N1 to ensure that the voltage at the first node N1 is substantially insensitive to changes in temperature.

In this manner, the DCO 50 of FIG. 6 may provide the output signal OUT having a stable output frequency by compensating for changes in the voltage at the first node N1 using the calibration circuit 55, such that the output frequency is insensitive to changes in temperature.

Figure 7:
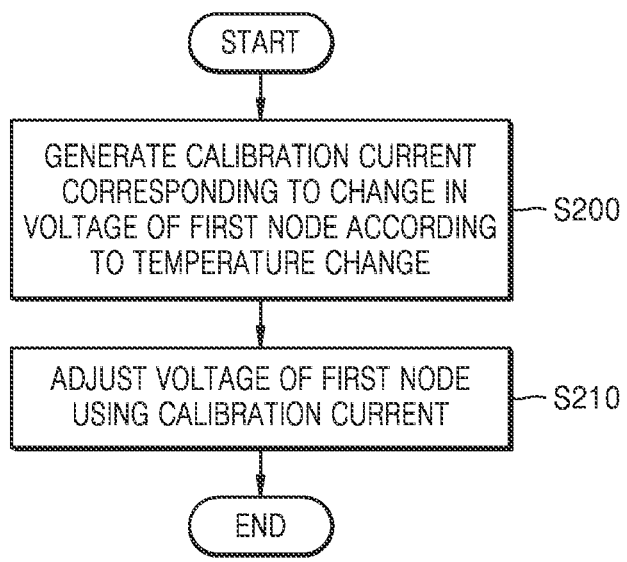
FIG. 7 is a flowchart illustrating an operating method for a DCO according to an embodiment of the inventive concept.

FIG. 7 is a flowchart illustrating an operating method for a DCO according to an embodiment of the inventive concept.

Referring to FIG. 7, the DCO may generate a calibration current corresponding to a change in a voltage apparent at a first node between a current mirror and a reference current source due to a change in temperature (S200). In some embodiments, the calibration current may be a current drawn from the first node, and may increase in response to an increase in a voltage at the first node, or may decrease in response to a decrease in the voltage at first node. The DCO may then adjust the voltage at the first node using the calibration current (S210). In this manner, the DCO may compensate for changes in the voltage at the first node to provide an output signal OUT having an output frequency that is substantially insensitive to changes in temperature.

Figure 8:
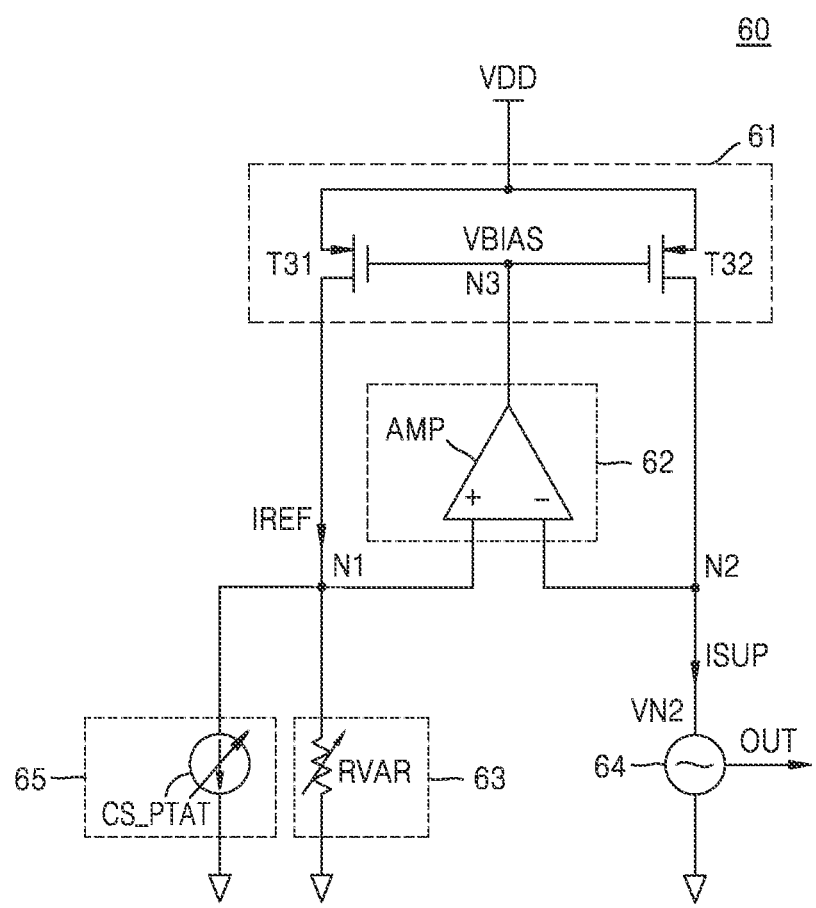
FIG. 8 is a block diagram illustrating a DCO according to an embodiment of the inventive concept.

FIG. 8 is a block diagram illustrating a DCO 60 according to an embodiment of the inventive concept. The DCO 60 may include a current mirror 61, a feedback circuit 62, a variable resistor 63, an oscillation circuit 64, and a calibration circuit 65. Only material difference(s) between the embodiment of FIG. 8 and the previous description provided in relation to FIGS. 1 and 6 will be highlighted.

Referring to FIG. 8, the calibration circuit 65 may include a calibration current source CS_PTAT connected in parallel with the variable resistor 63 between the first node N1 and ground. In some embodiments in this regard, the variable resistor 63 may be characterized by a Proportional-To-Absolute-Temperature (PTAT) in which resistance increases as temperature increases. Thus, as temperature increases, the voltage at first node N1 (e.g., the voltage applied to the variable resistor 63) may increase. Accordingly, the calibration current source CS_PTAT may be used to generate an increased calibration current in response to the increased voltage at the first node N1, that reduces the voltage at the first node N1 by drawing the increased calibration current from the first node N1. Further, as the temperature decreases, the voltage at the first node N1 may decrease. accordingly, the calibration current source CS_PTAT may generate a decreased calibration current in response to the decreased voltage at the first node N1, and increase the voltage at the first node N1 by drawing the decreased calibration current from the first node N1.

In some embodiments, the calibration current source CS_PTAT may have the same PTAT characteristic as the variable resistor 63. That is, the calibration current source CS_PTAT may generate a calibration current that increases as the temperature increases.

In some other embodiments, assuming that the variable resistor 63 is characterized by a Complementary-To-Absolute-Temperature (CTAT) characteristic, the calibration current source CS_PTAT may have a CTAT characteristic.

Figure 9A:
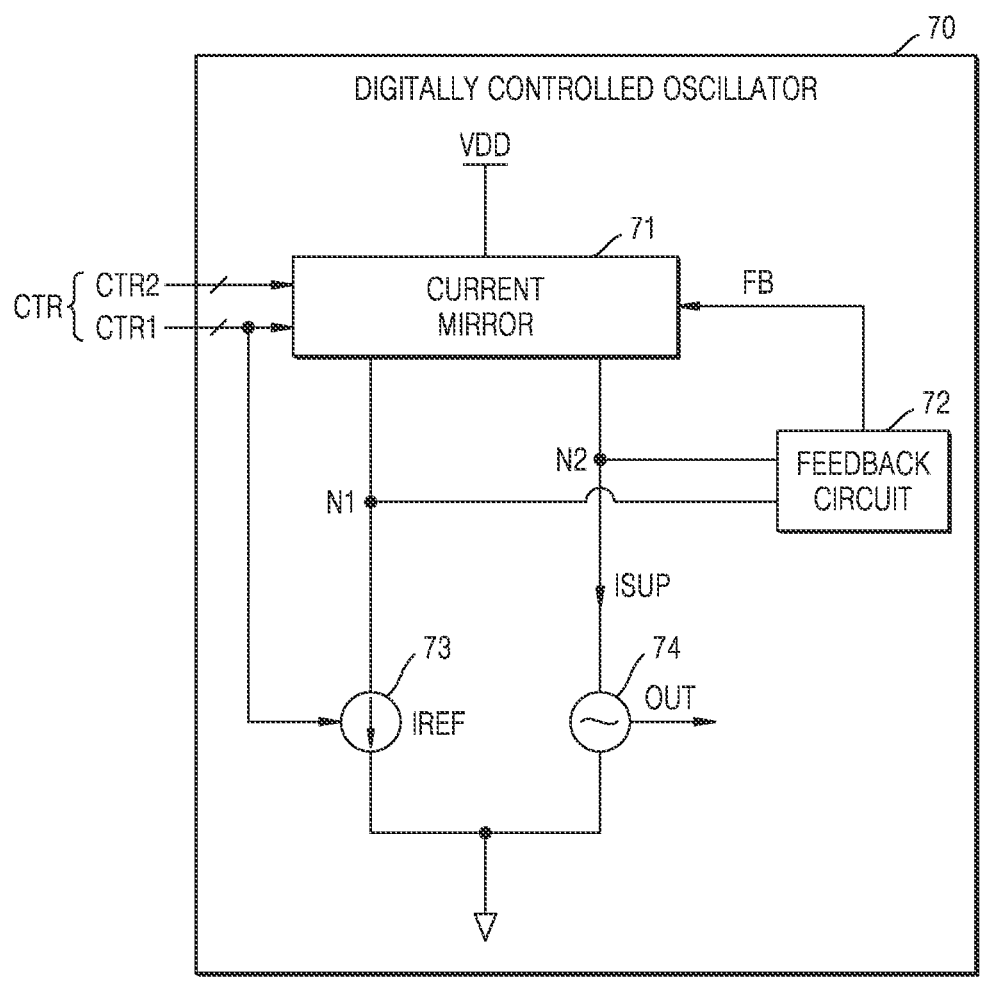
FIGS. 9A and 9B are respective block diagrams illustrating different versions of a DCO according to embodiments of the inventive concept.
Figure 9B:
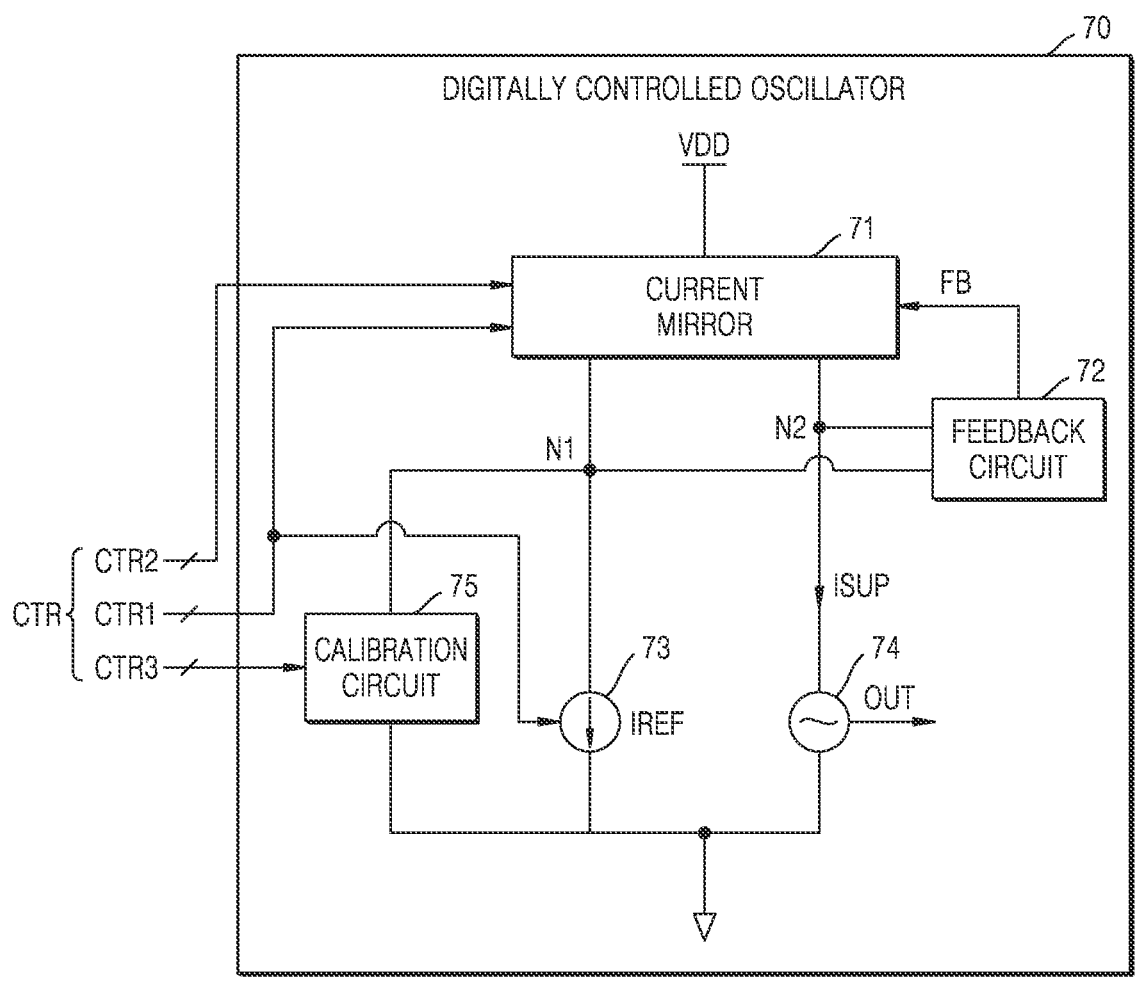

FIGS. 9A and 9B are respective block diagrams illustrating different versions of a DCO 70 according to embodiments of the inventive concept. Only material difference(s) between the embodiments of FIGS. 9A and 9B and the previous description provided in relation to FIGS. 1 and 6 will be highlighted.

Referring to FIG. 9A, the DCO 70 may receive the control signal CTR including the first and second control signals CTR1 and CTR2, and generate the output signal OUT having an output frequency that varies according to the control signal CTR. The DCO 70 of FIG. 9A may include a current mirror 71, a feedback circuit 72, a reference current source 73, and an oscillation circuit 74. The first control signal CTR1 may include at least one bit, and may be commonly provided to the current mirror 71 and the reference current source 73. Also, the second control signal CTR2 including at least one bit may be provided to the current mirror 71. The current mirror 71 and the reference current source 73 may determine the magnitude of the reference current IREF based on the first control signal CTR1. Also, the current mirror 71 may determine the magnitude of the supply current ISUP based on the second control signal CTR2 and the reference current IREF.

In some embodiments, the first control signal CTR1 may be used to coarsely adjust a frequency of the output signal OUT, while the second control signal CTR2 may be used to finely adjust the frequency of the output signal OUT. As will be described hereafter in some additional detail with reference to FIG. 10, the first control signal CTR1 may be provided not only to the reference current source 73, but also to the current mirror 71, such that the reference current IREF may increase/decrease in accordance with a convex function, instead of linearly increasing/decreasing function in accordance with the first control signal CTR1.

Referring to FIG. 9B, the first control signal CTR1 may be commonly provided to the current mirror 71 and the reference current source 73, the second control signal CTR2 may be provided to the current mirror 71, and the third control signal CTR3 including at least one bit may be provided to the calibration circuit 75. The calibration circuit 75 may determine the magnitude of a calibration current based on the third control signal CTR3.

In some embodiments, the DCO 70 may receive the control signal CTR having a specific value to generate the output signal OUT having a desired frequency. In addition, the DCO 70 may suppress a change in a bias voltage of the current mirror 71 according to changes in PVT using the feedback circuit 72, and suppress a change in the voltage of the first node N1 according to the change in temperature using the calibration circuit 75.

Figure 10:
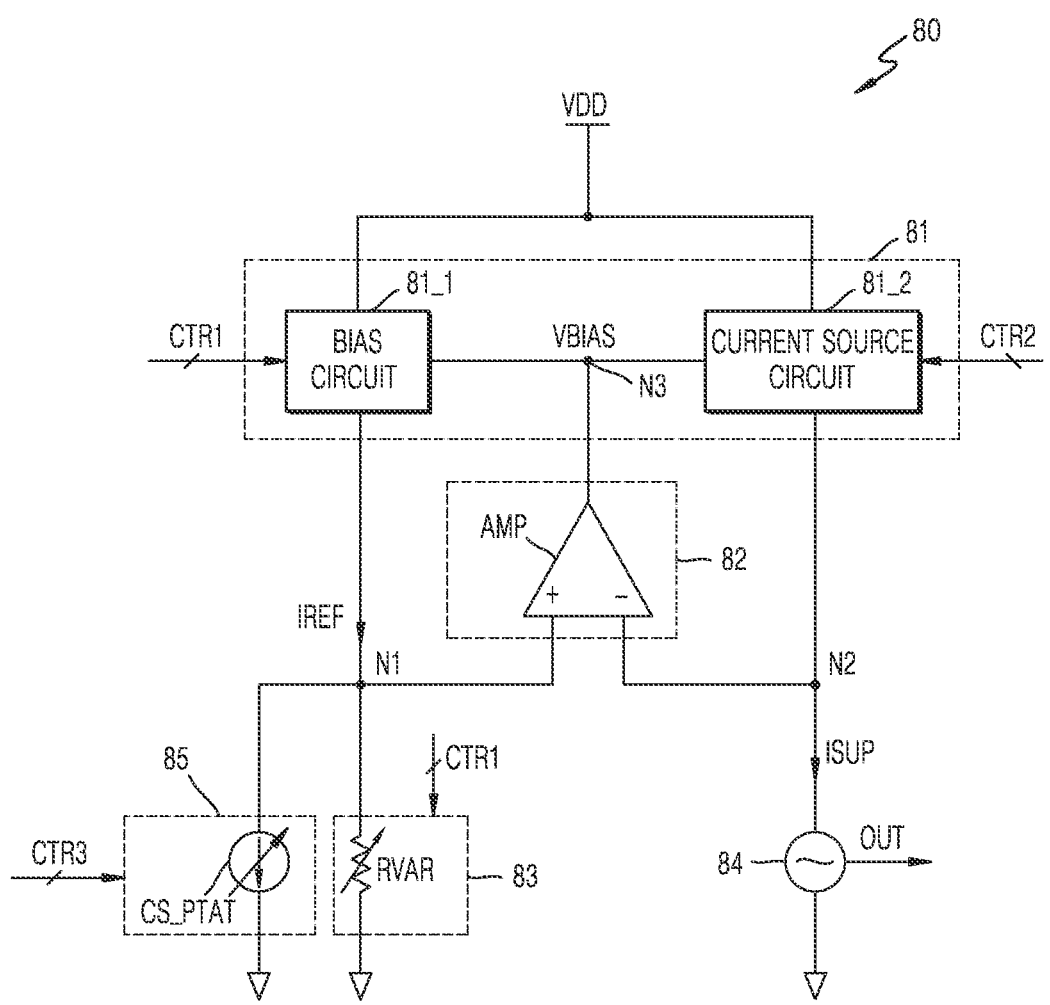
FIG. 10 is a block diagram illustrating a DCO according to an embodiment of the inventive concept.

FIG. 10 is a block diagram illustrating a DCO 80 according to an embodiment of the inventive concept. Analogous to the description presented in relation to FIGS. 9A and 9B, the DCO 80 may receive the first, second and third control signals CTR1, CTR2, and CTR3 and generate the output signal OUT having a frequency that varies according to the first to third control signals CTR1 to CTR3. As shown in FIG. 10, the DCO 80 may include a current mirror 81, a feedback circuit 82, a variable resistor 83, an oscillation circuit 84, and a calibration circuit 85. The feedback circuit 82 according to the embodiment may include the amplifier AMP, and the calibration circuit 85 may include the calibration current source CS_PTAT.

Referring to FIG. 10, the current mirror 81 may receive the first control signal CTR1 in common with the variable resistor 83 and may solely receive the second control signal CTR2. The magnitude of the first reference current IREF may be determined according to the first control signal CTR1, and the magnitude of the supply current ISUP may be determined according to the reference current IREF and the second control signal CTR2. As shown in FIG. 10, the current mirror 81 may include a bias circuit 81_1 and a current source circuit 81_2.

The bias circuit 81_1 may receive the first control signal CTR1, provide the reference current IREF from the power voltage VDD, and generate the bias voltage VBIAS based on the first control signal CTR1 and the reference current IREF. The bias circuit 81_1 may provide the bias voltage VBIAS to a current source circuit 81_2 through the third node N3.

For example, when the current source circuit 81_2 outputs the decreased supply current ISUP in response to the increase in the bias voltage VBIAS, the bias circuit 81_1 may decrease the bias voltage VBIAS in response to the first control signal CTR1 that decreases the resistance RVAR of the variable resistor 83. Also, the bias circuit 81_1 may increase the bias voltage VBIAS in response to the first control signal CTR1 that increases the resistance RVAR of the variable resistor 83. An example of the bias circuit 81_1 will be described later with reference to FIG. 11B.

The current source circuit 81_2 may generate the supply current ISUP based on the bias voltage VBIAS and the second control signal CTR2. For example, the current source circuit 81_2 may increase the supply current ISUP in response to the decreasing bias voltage VBIAS. In some embodiments, the current source circuit 81_2 may generate the supply current ISUP having a magnitude proportional to or inversely proportional to a value of the second control signal CTR2. An example of the current source circuit 81_2 will be described later with reference to FIG. 11C.

The variable resistor 83 may provide the resistance RVAR that varies according to the first control signal CTR1 including at least one bit. In some embodiments, the variable resistor 83 may provide the resistance RVAR that decreases as the value of the first control signal CTR1 increases. For example, the resistance RVAR of the variable resistor 83 may be inversely proportional to the value of the control signal CTR1. When the resistance RVAR of the variable resistor 83 decreases according to the first control signal CTR1, the reference current IREF may increase, while when the resistance RVAR of the variable resistor 83 increases according to the first control signal CTR1, the reference current IREF may decrease. An example of the variable resistor 83 will be described later with reference to FIG. 11A. Also, the calibration circuit 85 may provide a calibration current that varies according to the third control signal CTR3 including at least one bit.

Figure 11A:
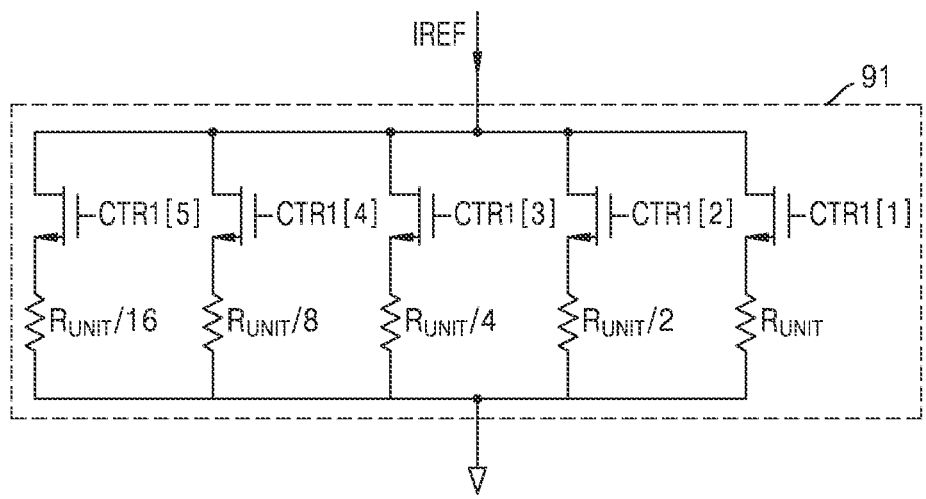
FIGS. 11A, 11B and 11C are circuit diagrams respectively illustrating the variable resistor 83, the bias circuit 81_1, and the current source circuit 81_2 of FIG. 10 according to an embodiment of the inventive concept.
Figure 11B:
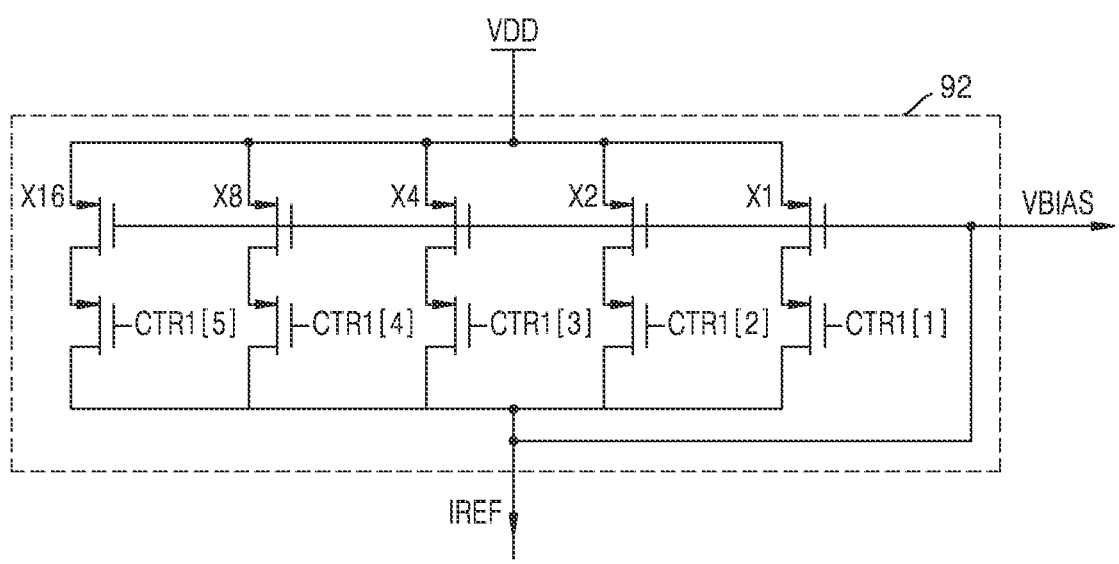
Figure 11C:
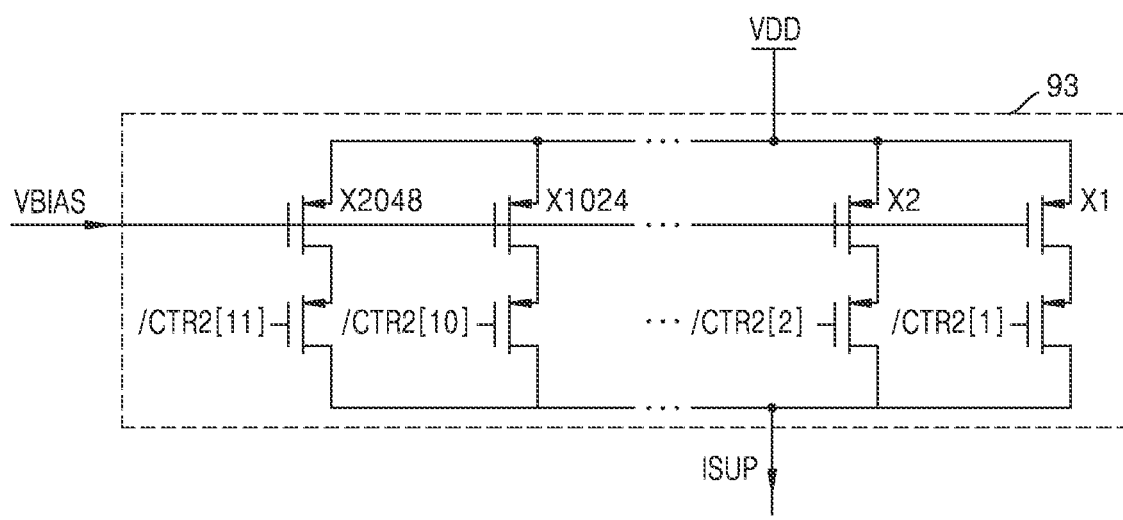

FIGS. 11A, 11B and 11C are circuit diagrams respectively illustrating examples of the variable resistor 83, the bias circuit 81_1, and the current source circuit 81_2 of FIG. 10 according to an embodiment of the inventive concept. In FIGS. 11A and 11B, the first control signal CTR1 includes five (5) bits, but this is just a selected example. Further, it is assumed that a bit value of "1" corresponds to a 'high' level voltage, and a bit value of "0" corresponds to a "low" level voltage.

Referring to FIG. 11A, the variable resistor 91 may include N-channel transistors respectively connected in series with a corresponding resistor. Here, a gate of each of the N-channel transistors may receive one bit of the first control signal CTR1. When one bit of the first control signal CTR1 is "1", an N-channel transistor is turned ON and the corresponding resistor series connected to the N-channel transistor will be electrically connected between opposing ends of the variable resistor 91. With this configuration, the variable resistor 91 may selectively provide $2^{1-k}$ times a unit resistance (RUNIT) between a current mirror and a ground voltage according to a k-th bit CTR1[k] of the first control signal CTR1, where 'k' is a positive integer. For example, when the k-th bit CTR1[k] of the first control signal CTR1 is '1', a resistor having a resistance of "RUNIT/$2^{k-1}$" may be electrically connected to both ends of the variable resistor 91. For example, when a second bit CTR1[2] of the first control signal CTR1 is '1', a resistor having a resistance of "RUNIT/2" may be electrically connected to both ends of the variable resistor 91. Accordingly, the resistance of the variable resistor 91 of FIG. 11A may be inversely proportional to the value of the first control signal CTR1.

Referring to FIG. 11B, the bias circuit 92 may include upper and lower, series-connected P-channel transistors. The lower P-channel transistors may include a gate receiving one bit of the first control signal CTR1, and the upper P-channel transistors may include a gate to which the bias voltage VBIAS is applied. When one bit of the first control signal CTR1 is "0", the P-channel transistor may be turned ON, and the P-channel transistor connected in series with the turned-on P-channel transistor may be enabled.

The bias circuit 92 may selectively enable/disable a P-channel transistor having $2^{k-1}$ times the unit size according to the k-th bit CTR1[k] of the first control signal CTR1. The enabled P-channel transistor may pass at least a part of the reference current IREF, and may contribute to generation of the bias voltage VBIAS. For example, when the k-th bit CTR1[k] of the first control signal CTR1 is '0', a P-channel transistor having a size of "$2^{k-1} \cdot X1$" may be enabled. The size of the P-channel transistor may correspond to a width of the P-channel, and the larger the size of the P-channel transistor, the higher the current driving capability. For example, when the second bit CTR1[2] of the first control signal CTR1 is '0', a P-channel transistor having a size of "X2" may be enabled.

Referring further to FIG. 11C, the current source circuit 93 may generate the supply current ISUP based on the bias voltage VBIAS and the second control signal CTR2. The current source circuit 93 may receive an inverted second control signal /CTR2, and the inverted second control signal /CTR2 is shown to include 11 bits, but it will be understood that embodiments of the inventive concept the inventive concept is not limited thereto.

The current source circuit 93 may enable/disable the P-channel transistor having $2^k$ times the unit size according to a k-th bit CTR2[k] of the second control signal CTR2. The enabled P-channel transistor may pass at least a part of the supply current ISUP according to the bias voltage VBIAS. For example, when the k-th bit CTR2[k] of the second control signal CTR2 is '1', a k-th bit (/CTR2[k]) of an inverted second control signal /CTR2 may be '0', and a P-channel transistor having a size of "$2^k \cdot X1$" may be enabled.

Figure 12:
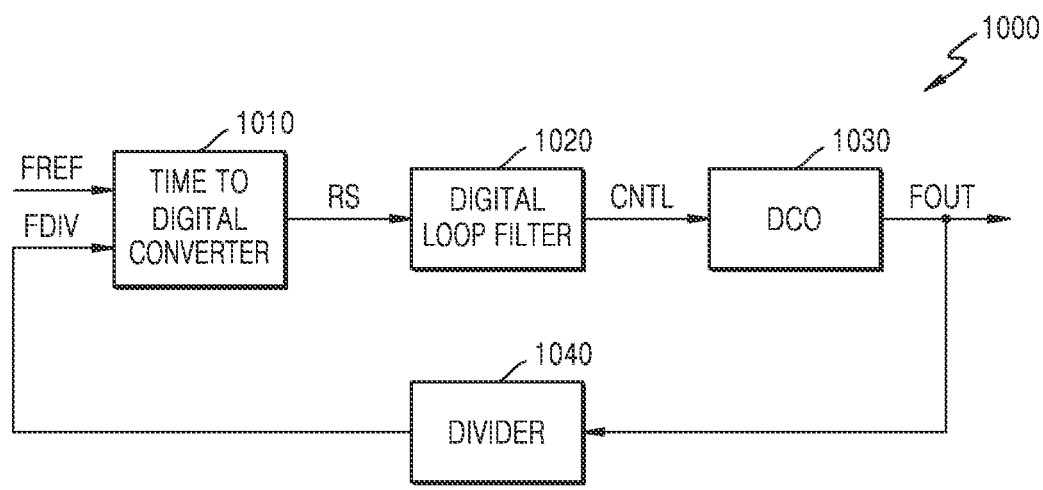
FIG. 12 is a block diagram illustrating a digital phase locked loop (PLL) according to an embodiment of the inventive concept.

FIG. 12 is a block diagram illustrating a digital PLL 1000 according to an embodiment of the inventive concept.

Referring to FIG. 12, the digital PLL 1000 may include a time-to-digital converter 1010, a digital loop filter 1020, a DCO 1030, and a divider 1040.

The divider 1040 may divide the output signal FOUT received from the DCO 1030. As an example, the divider 1040 may be a multi-coefficient divider. The time-to-digital converter 1010 may receive a division signal FDIV from the divider 1040 and receive an externally provided reference frequency signal FREF. The time-to-digital converter 1010 may compare a phase of a frequency division signal FDIV and a phase of the reference frequency signal FREF, and generate a comparison signal RS indicating a comparison result. The comparison signal RS is a signal including at least one bit and may indicate a phase difference between the division signal FDIV and the reference frequency signal FREF. The digital loop filter 1020 may generate a control signal CNTL including a phase error signal between the division signal FDIV and the reference frequency signal FREF based on the comparison signal RS. The DCO 1030 may generate the output signal FOUT based on the control signal CNTL.

Consistent with the foregoing, the DCO 1030 of FIG. 12 may use a feedback circuit to generate negative feedback with respect to a change in a bias voltage of a current mirror due to change in PVT, thereby suppressing change in the bias voltage. In some embodiments, the DCO 1030 may further use a calibration circuit to generate a calibration current that suppresses a voltage change due to temperature change at a node between the current mirror and a reference current source.

Accordingly, the digital PLL 1000 may output the output signal FOUT having an output frequency that is substantially insensitive to changes in PVT.

Figure 13:
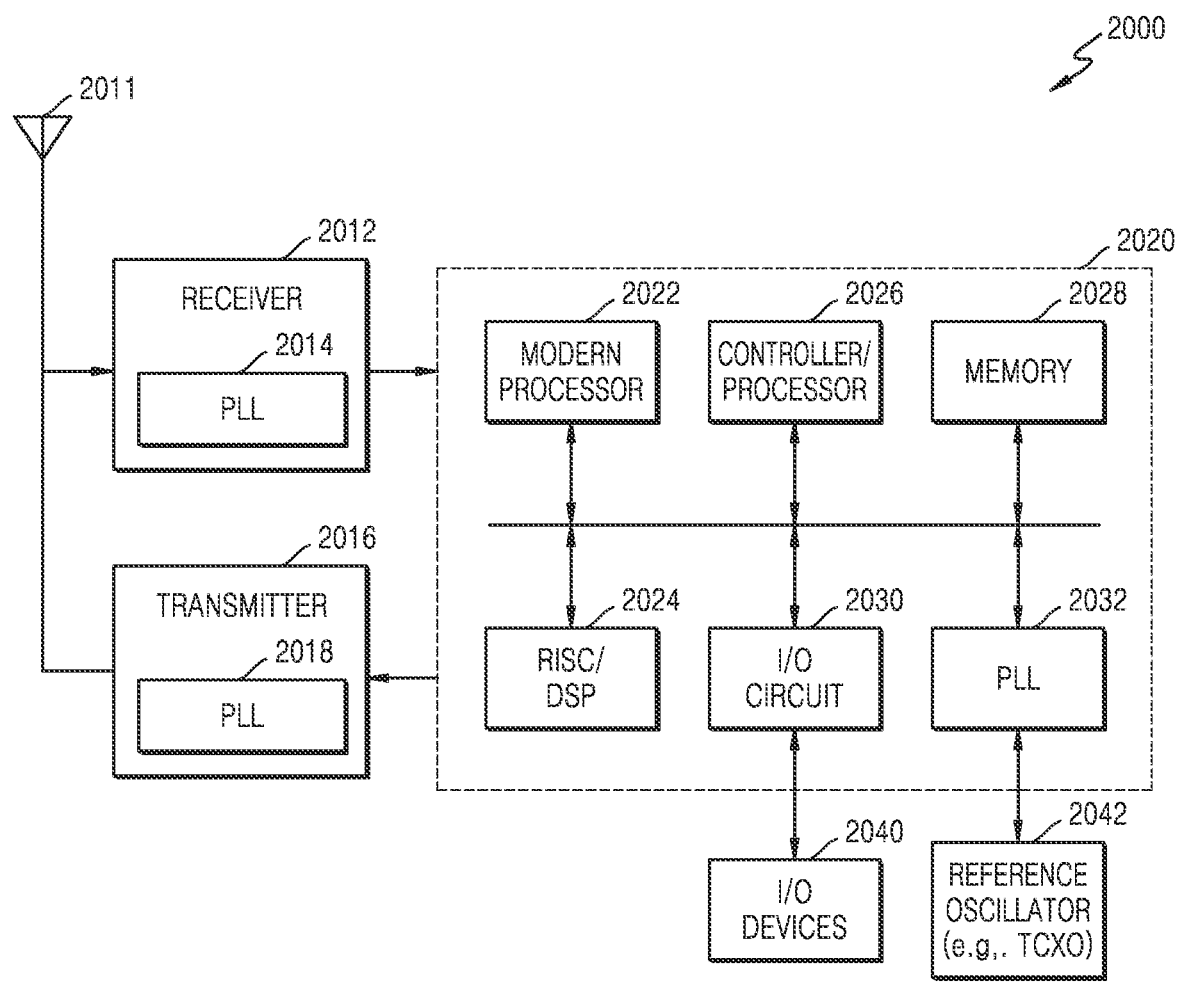
FIG. 13 is a block diagram illustrating an electronic device according to an embodiment of the inventive concept.

FIG. 13 is a block diagram illustrating an electronic device 2000 according to an embodiment of the inventive concept.

Referring to FIG. 13, the electronic device 2000 may include an antenna 2011, a receiver 2012, a transmitter 2016, a communication module 2020, an input/output (I/O) device 2040, and a reference oscillator 2042. The receiver 2012 may include a PLL 2014 including a DCO consistent with an embodiment of the inventive concept. The transmitter 2018 may also include the PLL 2014 including a DCO consistent with an embodiment of the inventive concept. The receiver 2012 may convert an analog signal received from the outside through the antenna 2011 into a digital signal using an output signal of the PLL 2014 and then provide the digital signal to the communication module 2020. The transmitter 2016 may convert the digital signal received from the communication module 2020 into an analog signal using the output signal of the PLL 2018 and then output it to the outside through the antenna 2011.

The communication module 2020 may include a modem processor 2022, a RISC/DSP 2024, a controller/processor 2026, a memory 2028, an I/O device 2030, and a PLL 2032.

The modem processor 2022 may perform processing operations such as encoding, modulation, demodulation, and decoding for data transmission and data reception. The RISC/DSP 2024 may perform general or specialized processing operations in the communication device 2000. The controller/processor 2026 may control blocks in the communication module 1020. Memory 2028 may store data and various command codes. The I/O device 2030 may communicate with the external I/O device 2040. The PLL 2032 may include the DCO according to embodiments of the inventive concept. The reference oscillator 2042 may be implemented as a crystal oscillator (XO), a voltage controlled crystal oscillator (VCXO), a temperature compensated crystal oscillator (TCXO), etc. The communication module 2020 (e.g., the modem processor 2022 or the controller/processor 2026) may use the output signal generated by the PLL 2032 to perform a processing operation necessary for communication.

Figure 14:
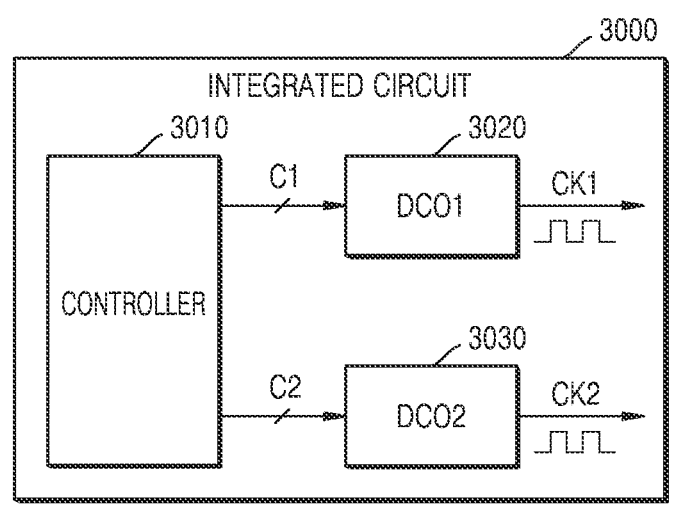
FIG. 14 is a block diagram illustrating an integrated circuit according to an embodiment of the inventive concept.

FIG. 14 is a block diagram illustrating an integrated circuit 3000 according to an embodiment of the inventive concept. The integrated circuit 3000 may include at least some such as, in some embodiments, an Application Processor (AP), a Timing Controller (TCON), a semiconductor memory device, an Internet of Things (IoT) component, a Subscriber Identification Module (SIM) card, a biometric sensor, a communication device, etc. As shown in FIG. 14, the integrated circuit 3000 may include a controller 3010, a first DCO 3020 and a second DCO 3030, and in some embodiments the integrated circuit 3000 may include three or more DCOs.

In some embodiments, the integrated circuit 3000 may include a DCO to generate a clock signal. For example, the first DCO 3020 may generate a first clock signal CK1, while the second DCO 3030 may generate a second clock signal CK2. Each of the first clock signal CK1 and the second clock signal CK2 may have different transition levels and/or frequencies, and may be supplied to other components included in the integrated circuit 3000 or may be output to the outside of the integrated circuit 3000. The controller 3010 may respectively provide the control signals C1 and C2 including a plurality of bits to the first DCO 3020 and the second DCO 3030 in order to set the frequencies of the first clock signal CK1 and the second clock signal CK2. As described above with reference to the drawings, the first DCO 3020 and the second DCO 3030 each include a feedback circuit and a calibration circuit according to embodiments of the inventive concept to output the first and second clock signals CK1 and CK2 insensitive to changes in PVT.

While the inventive concept has been particularly shown and described with reference to embodiments thereof, it will be understood that various changes in form and details may be made therein without departing from the spirit and scope of the following claims.

What is claimed is:

1. A digitally controlled oscillator (DCO) comprising:
a current mirror configured to generate a supply current in response to a bias voltage corresponding to a reference current;
a variable resistor connected to the current mirror through a first node outputting the reference current and configured to provide a variable resistance in response to a first control signal;
an oscillation circuit connected to the current mirror through a second node outputting the supply current and configured to generate an oscillation signal in response to the supply current; and
a feedback circuit configured to control the bias voltage in relation to at least one of a voltage at the first node and a voltage at the second node, wherein:
the feedback circuit comprises:
a first input terminal connected to the first node;
a second input terminal connected to the second node; and
an output terminal connected to a third node associated with the current mirror,
the current mirror comprises:
a bias circuit including the third node and configured to generate the bias voltage in response to the reference current and the first control signal; and
a current source circuit configured to generate the supply current in response to the bias voltage, and
the third node outputs the bias voltage to the current source circuit.

2. The DCO of claim 1, wherein the feedback circuit is further configured to increase the bias voltage in response to an increase in the voltage at the first node and decrease the bias voltage in response to a decrease in the voltage at the first node.

3. The DCO of claim 1, wherein the feedback circuit comprises an amplifier configured to amplify a difference between the voltage at the first node and the voltage at the second node to generate feedback and provide the feedback to the current mirror.

4. The DCO of claim 3, wherein the bias voltage is adjusted in response to the feedback.

5. The DCO of claim 1, wherein the current source circuit is further configured to generate the supply current in response to a second control signal.

6. The DCO of claim 1, further comprising a calibration circuit configured to calibrate the voltage at the first node in response to a change in resistance of the variable resistor due to a change in temperature.

7. The DCO of claim 6, wherein the calibration circuit comprises:

a calibration current source having a characteristic corresponding to a temperature change characteristic of the variable resistor, the calibration current source connected in parallel with the variable resistor between the first node and ground, and
a calibration current source configured to generate a calibration current that calibrates the voltage at the first node.

8. The DCO of claim 7, wherein each of the variable resistor and the calibration current source has a proportional-to-absolute-temperature (PTAT) characteristic.

9. The DCO of claim 7, wherein the calibration current source is further configured to generate the calibration current in response to a second control signal.

10. A digitally controlled oscillator (DCO) comprising:
a current mirror including a third node and configured to generate a supply current in response to a bias voltage corresponding to a reference current;
a variable resistor connected to the current mirror through a first node outputting the reference current and configured to provide a variable resistance;
an oscillation circuit connected to the current mirror through a second node outputting the supply current and configured to receive the supply current;
a calibration circuit configured to calibrate a voltage at the first node in response to a change in resistance of the variable resistor due to a change in temperature; and
an amplifier including a first input terminal connected to the first node to receive the voltage at the first node, a second input terminal connected to the second node to receive a voltage at the second node, and an output terminal connected to the third node, wherein:
the amplifier is configured to generate feedback in response to a difference between the voltage at the first node and the voltage of the second node and provide the feedback to the third node, and
the calibration circuit comprises:
a calibration current source having a characteristic corresponding to a temperature change characteristic of the variable resistor, the calibration current source connected in parallel with the variable resistor between the first node and ground; and
the calibration current source configured to generate a calibration current that calibrates the voltage at the first node.

11. The DCO of claim 10, wherein a voltage at the third node corresponds to the bias voltage.

12. The DCO of claim 10, wherein the current mirror comprises:
a bias circuit configured to generate the bias voltage in response to the reference current; and
a current source circuit configured to generate the supply current in response to the bias voltage, wherein
the third node is connected to the bias circuit and the current source circuit.

13. The DCO of claim 10, wherein the feedback increases the bias voltage in response to an increase in the voltage at the first node and decreases the bias voltage in response to a decrease in the voltage at the first node.

14. The DCO of claim 10, further comprising:
a calibration current source connected in parallel with the variable resistor between the first node and ground, wherein
the calibration current source is configured to adjust the voltage at the first node.

15. A digital phase locked loop (PLL) comprising:
- a divider configured to divide a clock signal and output a divided signal;
- a time-to-digital converter configured to compare the divided signal with a reference signal and output a comparison signal;
- a digital loop filter configured to output a control signal in response to the comparison signal; and
- a digital control oscillator (DCO) configured to output a clock signal having a frequency adjusted in response to the control signal, wherein:

the DCO comprises:
- a current mirror including a third node and configured to generate a supply current in response to a bias voltage corresponding to a reference current;
- a variable resistor connected to the current mirror through a first node outputting the reference current;
- an oscillation circuit connected to the current mirror through a second node outputting the supply current; and
- an amplifier including a first input terminal connected to the first node, a second input terminal connected to the second node, and an output terminal connected to the third node, the current mirror comprises:
- a bias circuit configured to generate the bias voltage in response to the reference current; and
- a current source circuit configured to generate the supply current in response to the bias voltage, and the third node is connected to the bias circuit and the current source circuit.

16. The digital PLL of claim 15, wherein:
the third node outputs the bias voltage, and
the amplifier is configured to increase the bias voltage in response to an increase in a voltage at the first node and decrease the bias voltage in response to a decrease in the voltage at the first node.

* * * * *